United States Patent  (10) Patent No.: US 11,508,418 B2
Kim  (45) Date of Patent: Nov. 22, 2022

(54) SYSTEM FOR PERFORMING REFERENCE VOLTAGE TRAINING OPERATION

(71) Applicant: SK hynix Inc., Icheon-si (KR)

(72) Inventor: Woongrae Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 295 days.

(21) Appl. No.: 16/989,392

(22) Filed: Aug. 10, 2020

(65) Prior Publication Data

US 2021/0335395 A1   Oct. 28, 2021

(30) Foreign Application Priority Data

Apr. 24, 2020  (KR) .................. 10-2020-0050395

(51) Int. Cl.
*G11C 5/14* (2006.01)
*G11C 7/10* (2006.01)

(52) U.S. Cl.
CPC ............ *G11C 5/147* (2013.01); *G11C 7/1093* (2013.01)

(58) Field of Classification Search
CPC .. G11C 5/147; G11C 5/04; G11C 7/14; G11C 7/222; G11C 7/1093; G11C 29/021; G11C 29/028; G11C 8/18; G06F 3/0659; G06F 3/0673
See application file for complete search history.

(56) References Cited

U.S. PATENT DOCUMENTS

2013/0346684 A1  12/2013  Bains
2019/0156872 A1*  5/2019  Kim ..................... G11C 7/1093

FOREIGN PATENT DOCUMENTS

KR     1020170050057 A     5/2017

* cited by examiner

*Primary Examiner* — Sultana Begum
(74) *Attorney, Agent, or Firm* — William Park & Associates Ltd.

(57) ABSTRACT

A system to perform a reference voltage training operation may include: a controller configured to output a dock signal, a chip selection signal, a command address and data; and a semiconductor device configured to enter a training mode to control the level of a reference voltage when the chip selection signal and the command address are a first logic level combination in synchronization with the clock signal, configured to enter an ID setting mode to set a storage ID when the chip selection signal and the command address are a second logic level combination, and configured to enter an ID selection mode to update a voltage code that is generated in the training mode when the chip selection signal and the command address are a third logic level combination.

20 Claims, 20 Drawing Sheets

FIG. 3

| OPERATION MODE | CS | CA<1> | CA<2> | CA<3> | CA<4> | CA<5> | CA<6> | CA<7> | CA<8> | CA<9> | CA<10> | CA<11> | CA<12> | CA<13> |
|---|---|---|---|---|---|---|---|---|---|---|---|---|---|---|
| TRAINING MODE | L | H | H | L | L | L | OP<1> | OP<2> | OP<3> | OP<4> | OP<5> | OP<6> | OP<7> | OP<8> |
| ID SETTING MODE | L | H | H | H | H | L | L | L | L | L | E_ID<1> | E_ID<2> | E_ID<3> | E_ID<4> |
| | L | H | H | H | H | L | L | L | H | L | H | L | H | L |
| ID SELECTION MODE | L | H | H | H | H | L | L | H | H | H | S_ID<1> | S_ID<2> | S_ID<3> | S_ID<4> |
| | L | H | H | H | H | L | L | L | L | H | H | H | H | H |

SYSTEM FOR PERFORMING REFERENCE VOLTAGE TRAINING OPERATION

CROSS-REFERENCES TO RELATED APPLICATIONS

The present application claims priority to Korean application number 10-2020-0050395, filed on Apr. 24, 2020, which is incorporated by reference in its entirety.

BACKGROUND OF THE INVENTION

The present invention relates to a system for performing a reference voltage training operation.

In general, a memory device including a DDR SDRAM (Double Data Rate Synchronous DRAM) performs a data read/write operation based on a command that is inputted from an external controller. The memory device uses a reference voltage to decide the logic level of data to perform such a read/write operation. The reference voltage that is used in the memory device needs to be generated at an intermediate voltage level, between logic high and low levels of data, and a training operation is provided to control the voltage level of the reference voltage.

With the increase in degree of integration, a plurality of memory devices may be included in one package, and various methods are required to prevent operation errors among the plurality of memory devices.

SUMMARY OF THE INVENTION

In one embodiment, a system to perform a reference voltage training operation may include: a controller configured to output a dock signal, a chip selection signal, a command address, and data; and a semiconductor device configured to enter a training mode to control the level of a reference voltage when the chip selection signal and the command address are a first logic level combination in synchronization with the clock signal, configured to enter an ID setting mode to set a storage ID when the chip selection signal and the command address are a second logic level combination, and configured to enter an ID selection mode to update a voltage code that is generated in the training mode when the chip selection signal and the command address are a third logic level combination.

In another embodiment, a system to perform a reference voltage training operation may include: a controller configured to output a clock signal, a chip selection signal, a command address, first data, and second data; and a semiconductor device comprising a first memory device and a second memory device, wherein the semiconductor device is configured to, when enter a training mode to control the level of a reference voltage when the chip selection signal and the command address are a first logic level combination in synchronization with the clock signal, wherein the semiconductor device is configured to, when the chip selection signal and the command address are a second logic level combination, enter an ID setting mode to set a first storage ID for the first memory device and then set a second storage ID for the second memory device, and wherein the semiconductor device is configured to enter an ID selection mode to update a voltage code in the first and second memory devices when the chip selection signal and the command address are a third logic level combination.

BRIEF DESCRIPTION OF THE DRAWINGS

FIG. 3 is a table, showing the logic levels of a chip selection signal and command addresses to perform a training mode, an ID setting mode, and an ID selection mode in accordance with an embodiment.

DESCRIPTION OF SPECIFIC EMBODIMENTS

Figure 1:
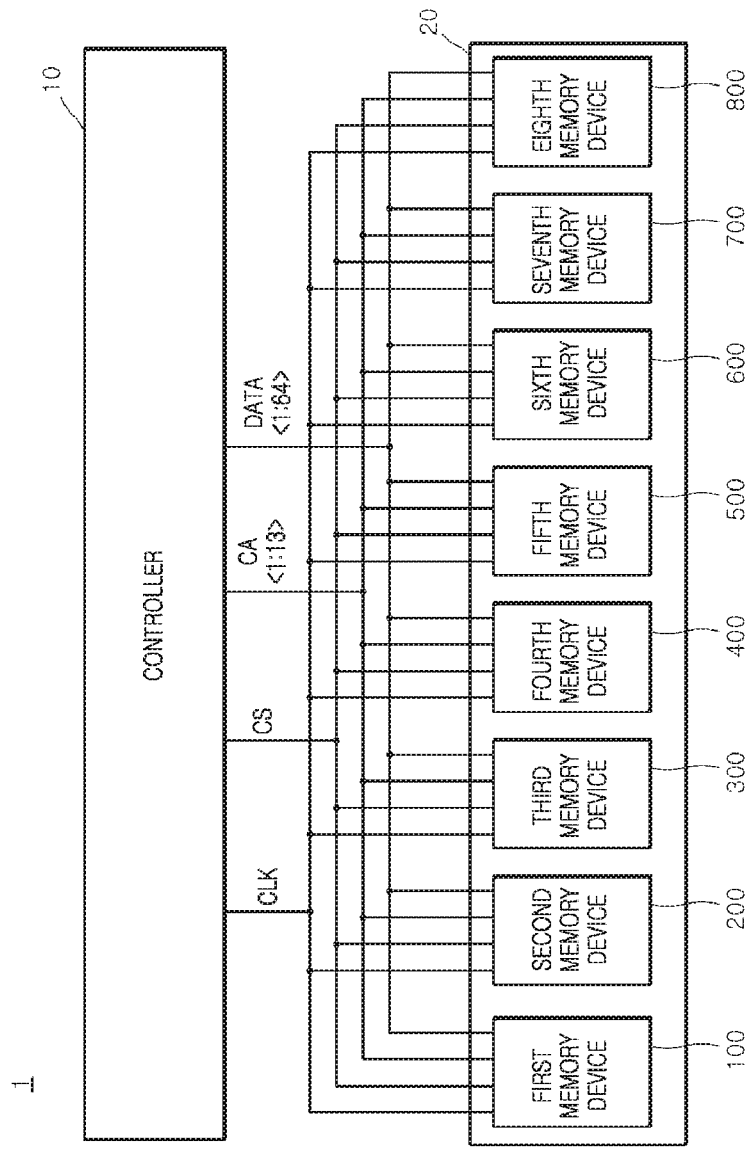
FIG. 1 is a block diagram, illustrating a configuration of a system to perform a reference voltage training operation in accordance with an embodiment.

The term "preset" indicates that the value of a parameter is previously decided, when the parameter is used in a process or algorithm. According to an embodiment, the value of the parameter may be set when the process or algorithm is started or while the process or algorithm is performed.

The terms such as "first" and "second", which are used to distinguish among various components, are not limited by the components. For example, a first component may be referred to as a second component, and vice versa.

When one component is referred to as being "coupled" or "connected" to another component, it may indicate that the components are directly coupled or connected to each other or coupled or connected to each other through another component interposed therebetween. On the other hand, when one component is referred to as being "directly coupled" or "directly connected" to another component, it may indicate that the components are directly coupled or connected to each other without another component interposed therebetween.

"Logic high level" and "logic low level" are used to describe the logic levels of signals. A signal having "logic high level" is distinguished from a signal having "logic low level". For example, when a signal having a first voltage corresponds to "logic high level", a signal having a second voltage may correspond to "logic low level". According to an embodiment, "logic high level" may be set to a voltage higher than "logic low level". According to an embodiment, the logic levels of signals may be set to different logic levels or opposite logic levels. For example, a signal having a logic high level may be set to have a logic low level according to an embodiment, and a signal having a logic low level may be set to have a logic high level according to an embodiment.

Hereafter, the present disclosure will be described in more detail through embodiments. The embodiments are only used to exemplify the present disclosure, and the scope of the present disclosure is not limited by the embodiments.

Various embodiments of the present disclosure are directed to a system to perform a reference voltage training operation, which performs a training mode to generate voltage codes to set the voltage level of a reference voltage, used in a plurality of memory devices, based on command addresses that are inputted from a controller.

Also, various embodiments of the present disclosure are directed to a system to perform a reference voltage training operation, which performs an ID setting mode to set storage IDs of a plurality of memory devices based on command addresses that are inputted from a controller.

Also, various embodiments of the present disclosure are directed to a system to perform a reference voltage training operation, which performs an ID selection mode to compare storage IDs stored in an ID setting mode and selection IDs that are inputted from a controller and to update voltage codes generated in a training mode by selectively enabling operations of a plurality of memory devices.

In accordance with the present embodiments, the system can perform the reference voltage training operation of performing the training mode to generate the voltage codes to set the voltage level of the reference voltage, used in the plurality of memory devices, based on the command addresses that are inputted from the controller.

Furthermore, the system can perform the reference voltage training operation of performing the ID setting mode to set the storage IDs of the plurality of memory devices based on the command addresses that are inputted from the controller.

The system can perform the reference voltage training operation of performing the ID selection mode to compare the storage IDs stored in the ID setting mode and the selection IDs that are inputted from the controller and to update the voltage codes generated in the training mode by selectively enabling the operations of the plurality of memory devices.

As illustrated in FIG. 1, a semiconductor system 1 to perform a reference voltage training operation, in accordance with an embodiment, may include a controller 10 and a semiconductor device 20. The semiconductor device 20 may include a first memory device 100, a second memory device 200, a third memory device 300, a fourth memory device 400, a fifth memory device 500, a sixth memory device 600, a seventh memory device 700 and an eighth memory device 800.

The controller 10 may transmit a clock CLK to the semiconductor device 20 to control the semiconductor device 20. The controller 10 may transmit a chip selection signal CS to the semiconductor device 20 to control the semiconductor device 20. The controller 10 may transmit first to 13th command addresses CA<1:13> to the semiconductor device 20 to control the semiconductor device 20. The controller 10 and the semiconductor device 20 may transmit and receive first to 64th data DATA<1:64> to and from each other.

The controller 10 may output the clock CLK, the chip selection signal CS, and the first to 13th command addresses CA<1:13> to the semiconductor device 20 to perform a training mode. The controller 10 may output a first logic level combination of the chip selection signal CS and the first to 13th command addresses CA<1:13> to the semiconductor device 20 to perform the training mode. The controller 10 may output the clock CLK, the chip selection signal CS, the first to 13th command addresses CA<1:13> and the first to 64th data DATA<1:64> to the semiconductor device 20 to perform an ID setting mode. The controller 10 may output, to the semiconductor device 20, a second logic level combination of the chip selection signal CS and the first to 13th command addresses CA<1:13> to perform the ID setting mode. The controller 10 may output the clock CLK, the chip selection signal CS and the first to 13th command addresses CA<1:13> to the semiconductor device 20 to perform an ID selection mode. The controller 10 may output a third logic level combination of the chip selection signal CS and the first to 13th command addresses CA<1:13> to the semiconductor device 20 to perform the ID selection mode. The chip selection signal CS and the first to 13th command addresses CA<1:13> may be sequentially outputted in synchronization with odd pulses or even pulses that are included in the clock CLK.

The training mode may be set to a mode to set the voltage level of a reference voltage (VREF of FIG. 2) that is used in the semiconductor device 20 to a set voltage level. The set voltage level of the reference voltage (VREF of FIG. 2) may be set to a voltage level to detect the logic levels of the chip selection signal CS, the first to 13th command addresses CA<1:13>, and the first to 64th data DATA<1:64>. The ID setting mode may be set to a mode to set different IDs to the first to eighth memory devices 100, 200, 300, 400, 500, 600, 700, and 800 that are included in the semiconductor device 20. The ID selection mode may be set to a mode to update the voltage code in a memory device that corresponds to an ID set in the ID setting mode, among the first to eighth memory devices 100, 200, 300, 400, 500, 600, 700, and 800, the voltage code being generated to set the voltage level of the reference voltage (VREF of FIG. 2) in the training mode.

The first logic level combination of the chip selection signal CS and the first to 13th command addresses CA<1:13> for performing the training mode will be described in detail with reference to FIG. 3 which will be described below. The second logic level combination of the chip selection signal CS and the first to 13th command addresses CA<1:13> for performing the ID setting mode will be described in detail with reference to FIG. 3, which will be described below. The third logic level combination of the chip selection signal CS and the first to 13th command addresses CA<1:13> for performing the ID selection mode will be described in detail with reference to FIG. 3 which will be described below.

The first memory device 100 may enter the training mode when the chip selection signal CS and the first to 13th command addresses CA<1:13> are the first logic level combination in synchronization with the clock CLK. The first memory device 100 may generate voltage codes (VP<1:8> of FIG. 15) to set the voltage level of the reference voltage (VREF of FIG. 2) to the preset level in the training mode. The first memory device 100 may enter the ID setting mode when the chip selection signal CS and the first to 13th command addresses CA<1:13> are the second logic level combination in synchronization with the clock CLK, and the first data DATA<1> is at a preset logic level. The first memory device 100 may store a first ID that is generated based on the first to 13th command addresses CA<1:13> in the ID setting mode. The preset logic level of the first data DATA<1> that stores the first ID of the first memory device 100 in the ID setting mode may be set to a logic low level. The first memory device 100 may enter the ID setting mode when the chip selection signal CS and the first to 13th command addresses CA<1:13> are the third logic level combination in synchronization with the clock CLK. When the same first selection ID as the first ID is inputted in the ID selection mode, the first memory device 100 may update the voltage codes (VP<1:8> of FIG. 15) that are generated in the training mode.

The second memory device 200, the third memory device 300, the fourth memory device 400, the fifth memory device 500, the sixth memory device 600, the seventh memory device 700, and the eighth memory device 800 may be configured and operated in the same manner as the first memory device 100, except that the second to eighth memory devices 200, 300, 400, 500, 600, 700 and 800 receive the ninth data DATA<9>, the 17th data DATA<17>, the 25th data DATA<25>, the 33rd data DATA<33>, the 41st data DATA<41>, the 49th data DATA<49> and the 57th data DATA<57>, respectively. Thus, the detailed descriptions thereof will be omitted herein.

Figure 2:
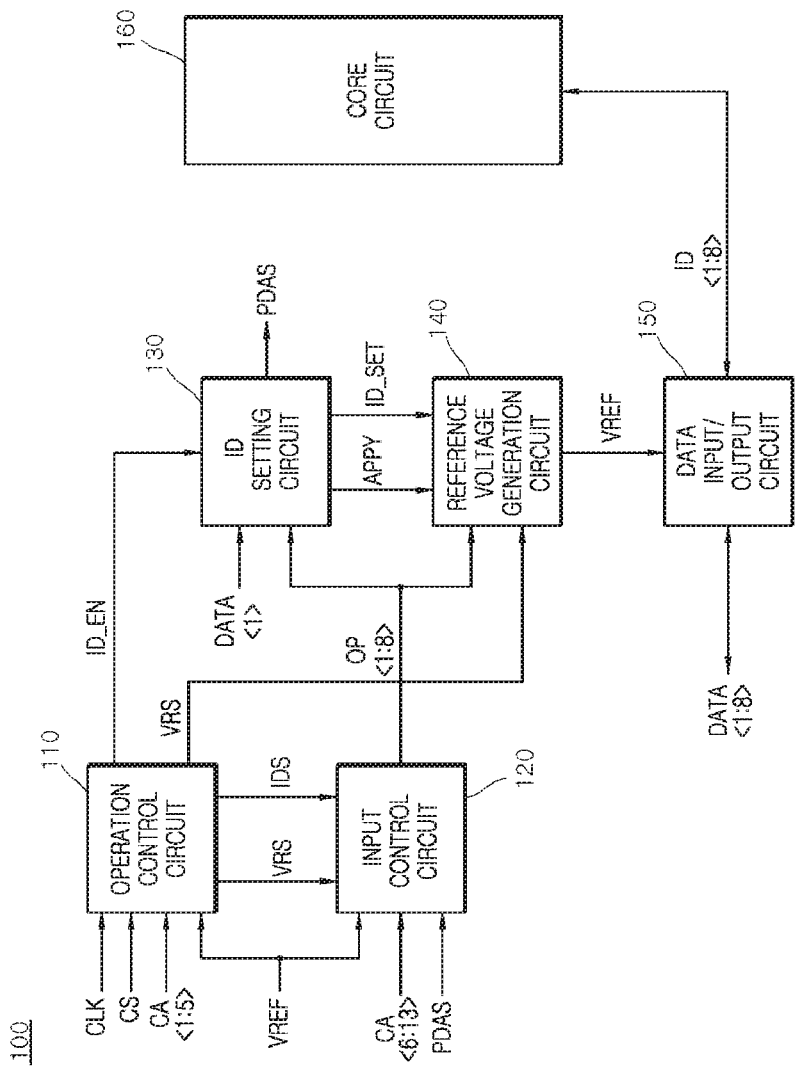
FIG. 2 is a block diagram, illustrating a configuration of a first memory device, included in the system that is illustrated in FIG. 1.

FIG. 2 is a block diagram, illustrating a configuration of the first memory device 100 that is included in the semiconductor device 20 in accordance with an embodiment. As illustrated in FIG. 2, the first memory device 100 may include an operation control circuit 110, an input control circuit 120, an ID setting circuit 130, a reference voltage generation circuit 140, a data input/output circuit 150, and a core circuit 160.

The operation control circuit 110 may generate a reference voltage command VRS that is enabled when the chip selection signal CS and the first to fifth command addresses CA<1:5> are the first logic level combination in synchronization with the clock CLK. The operation control circuit 110 may generate an ID command IDS and an ID enable signal ID_EN that are enabled when the chip selection signal CS and the first to fifth command addresses CA<1:5> are the second logic level combination in synchronization with the clock CLK. The operation control circuit 110 may generate the reference voltage command VRS by comparing the reference voltage VREF to the chip selection signal CS and the first to fifth command addresses CA<1:5> in synchronization with the clock CLK. The operation control circuit 110 may generate the ID command IDS and the ID enable signal ID_EN by comparing the reference voltage VREF to the chip selection signal CS and the first to fifth command addresses CA<1:5> in synchronization with the clock CLK.

The reference voltage VREF may be set to a voltage to detect the logic levels of the chip selection signal CS, the first to 13th command addresses CA<1:13> and the first to 64th data DATA<1:64>.

The input control circuit 120 may generate first to eighth operation codes OP<1:8> based on the sixth to 13th command addresses CA<6:13> when the reference voltage command VRS is enabled. The input control circuit 120 may generate the first to eighth operation codes OP<1:8> based on the sixth to 13th command addresses CA<6:13> when the ID command IDS is enabled. The input control circuit 120 may generate the first to eighth operation codes OP<1:8> based on the sixth to 13th command addresses CA<6:13> when an ID selection control signal PDAS is enabled. The input control circuit 120 may generate the first to eighth operation codes OP<1:8> by comparing the reference voltage VREF to the sixth to 13th command addresses CA<6:13>, when the reference voltage command VRS is enabled. The input control circuit 120 may generate the first to eighth operation codes OP<1:8> by comparing the reference voltage VREF to the sixth to 13th command addresses CA<6:13>, when the ID command IDS is enabled. The input control circuit 120 may generate the first to eighth operation codes OP<1:8> by comparing the reference voltage VREF to the sixth to 13th command addresses CA<6:13>, when the ID selection control signal PDAS is enabled.

In the ID setting mode, the ID setting circuit 130 may store a storage ID that is generated based on the first to eighth operation codes OP<1:8> when the first data DATA<1> is at the preset logic level. The ID setting circuit 130 may store the storage ID that is generated based on the first to eighth operation codes OP<1:8> when the first data DATA<1> is at the preset logic level during an interval in which the ID enable signal ID_EN is enabled. The ID setting circuit 130 may generate the ID selection control signal PDAS, which is enabled during the ID selection mode. During the ID selection mode, the ID setting circuit 130 may generate an ID control signal ID_SET and a supply control signal APPY when the storage ID coincides with a selection ID that is generated based on the first to eighth operation codes OP<1:8> inputted to the ID setting circuit 130.

The reference voltage generation circuit 140 may generate the voltage codes VP<1:8> based on the first to eighth operation codes OP<1:8> during the training mode. The reference voltage generation circuit 140 may generate the voltage codes VP<1:8> based on the first to eighth operation codes OP<1:8> when the ID control signal ID_SET and the reference voltage command VRS are enabled. The reference voltage generation circuit 140 may store the first to eighth operation codes OP<1:8> when the supply control signal APPY is enabled. The reference voltage generation circuit 140 may control the level of the reference voltage VREF based on the first to eighth voltage codes VP<1:8>.

The data input/output circuit 150 may generate first to eighth internal data ID<1:8> based on the first to eighth data DATA<1:8> during a write operation. The data input/output circuit 150 may generate the first to eighth internal data ID<1:8> by comparing the first to eighth data DATA<1:8> to the reference voltage VREF during the write operation. The data input/output circuit 150 may generate the first to eighth data DATA<1:8> based on the first to eighth internal data ID<1:8> during a read operation. The data input/output circuit 150 may generate the first to eighth data DATA<1:8> by comparing the first to eighth internal data ID<1:8> to the reference voltage VREF during the read operation.

The core circuit 160 may include a plurality of memory cells (not illustrated). The core circuit 160 may store the first to eighth internal data ID<1:8> during the write operation. The core circuit 160 may store the first to eighth internal data ID<1:8> in a memory cell (not illustrated) that is selected during the write operation. The core circuit 160 may output the first to eighth internal data ID<1:8> during the read operation. The core circuit 160 may output the first to eighth internal data ID<1:8> stored in the memory cell (not illustrated) that is selected during the read operation.

The second to eighth memory devices 200, 300, 400, 500, 600, 700 and 800 may be configured and operated in the same manner as the first memory device 100, except that the input and output signals thereof are different based on those of the first memory device 100. Thus, the detailed descriptions thereof will be omitted herein.

Referring to FIG. 3, the logic level combinations of the chip selection signal CS and the first to 13th command addresses CA<1:13> to enter the training mode, the ID setting mode, and the ID selection mode, respectively, will be described as follows.

In the first logic level combination of the chip selection signal CS and the first to fifth command addresses to enter the training mode, the chip selection signal CS is set to a logic low level, the first command address CA<1> is set to a logic high level, the second command address CA<2> is set to a logic high level, the third command address CA<3> is set to a logic low level, the fourth command address CA<4> is set to a logic low level, and the fifth command address CA<5> is set to a logic low level.

In the training mode, the ID setting mode, and the ID selection mode, the sixth to 13th command addresses CA<6:13> are set to bits for generating the first to eighth operation codes OP<1:8>.

In the second logic level combination of the chip selection signal CS and the first to 13th command addresses CA<1:13> to enter the ID setting mode, the chip selection signal CS is set to a logic low level, the first command address CA<1> is set to a logic high level, the second command address CA<2> is set to a logic high level, the third command address CA<3> is set to a logic high level, the fourth command address CA<4> is set to a logic high level, the fifth command address CA<5> is set to a logic low level, the sixth command address CA<6> is set to a logic low level, the seventh command address CA<7> is set to a logic low level, the eighth command address CA<8> is set to a logic low level, the ninth command address CA<9> is set to a logic low level, the tenth command address CA<10> is set to a logic high level, the 11th command address CA<11> is set to a logic low level, the 12th command address CA<12> is set to a logic high level, and the 13th command address CA<13> is set to a logic high level.

The chip selection signal CS and the first to 13th command addresses CA<1:13> that store first to fourth storage IDs E_ID<1:4> in the ID setting mode are set as follows. The chip selection signal CS is set to a logic low level, the first command address CA<1> is set to a logic high level, the second command address CA<2> is set to a logic high level, the third command address CA<3> is set to a logic high level, the fourth command address CA<4> is set to a logic high level, the fifth command address CA<5> is set to a logic low level, the sixth command address CA<6> is set to a logic low level, the seventh command address CA<7> is set to a logic high level, the eighth command address CA<8> is set to a logic high level, and the ninth command address CA<9> is set to a logic low level. Furthermore, the tenth command address CA<10> is set to the first storage ID the 11th command address CA<11> is set to the second storage ID E_ID<2>, the 12th command address CA<12> is set to the third storage ID E_ID<3>, and the 13th command address CA<13> is set to the fourth storage ID E_ID<3>.

In the logic level combination of the chip selection signal CS and the first to 13th command addresses CA<1:13> to exit the ID setting mode, the chip selection signal CS is set to a logic low level, the first command address CA<1> is set to a logic high level, the second command address CA<2> is set to a logic high level, the third command address CA<3> is set to a logic high level, the fourth command address CA<4> is set to a logic high level, the fifth command address CA<5> is set to a logic low level, the sixth command address CA<6> is set to a logic low level, the seventh command address CA<7> is set to a logic low level, the eighth command address CA<8> is set to a logic low level, the ninth command address CA<9> is set to a logic low level, the tenth command address CA<10> is set to a logic high level, the 11th command address CA<11> is set to a logic low level, the 12th command address CA<12> is set to a logic high level, and the 13th command address CA<13> is set to a logic low level.

In the third logic level combination of the chip selection signal CS and the first to 13th command addresses CA<1:13> to enter the ID selection mode, the chip selection signal CS is set to a logic low level, the first command address CA<1> is set to a logic high level, the second command address CA<2> is set to a logic high level, the third command address CA<3> is set to a logic high level, the fourth command address CA<4> is set to a logic high level, the fifth command address CA<5> is set to a logic low level, the sixth command address CA<6> is set to a logic low level, the seventh command address CA<7> is set to a logic high level, the eighth command address CA<8> is set to a logic high level, and the ninth command address CA<9> is set to a logic high level. Furthermore, the tenth command address CA<10> is set to a first selection ID S_ID<1>, the 11th command address CA<11> is set to a second selection ID S_ID<2>, the 12th command address CA<12> is set to a third selection ID S_ID<3>, and the 13th command address CA<13> is set to a fourth selection IDS_ID<4>.

In the logic level combination of the chip selection signal CS and the first to 13th command addresses CA<1:13> to exit the ID selection mode, the chip selection signal CS is set to a logic low level, the first command address CA<1> is set to a logic high level, the second command address CA<2> is set to a logic high level, the third command address CA<3> is set to a logic high level, the fourth command address CA<4> is set to a logic high level, the fifth command address CA<5> is set to a logic low level, the sixth command address CA<6> is set to a logic low level, the seventh command address CA<7> is set to a logic low level, the eighth command address CA<8> is set to a logic low level, the ninth command address CA<9> is set to a logic high level, the tenth command address CA<10> is set to a logic high level, the 11th command address CA<11> is set to a logic high level, the 12th command address CA<12> is set to a logic high level, and the 13th command address CA<13> is set to a logic high level.

Figure 4:
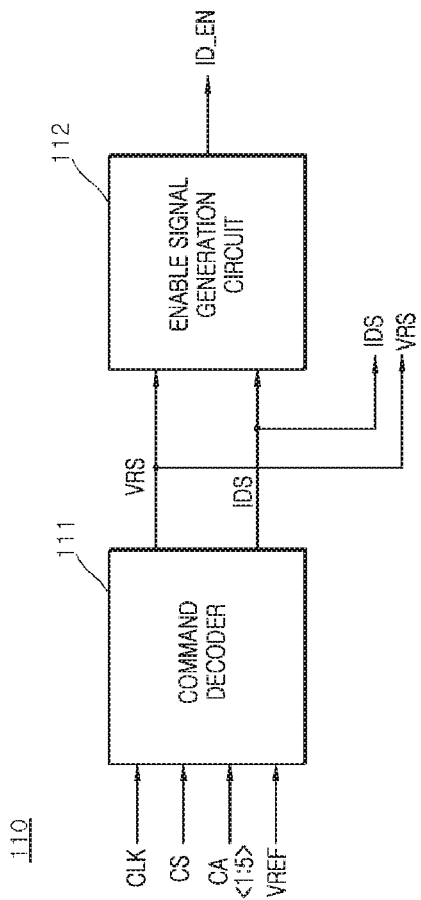
FIG. 4 is a block diagram, illustrating a configuration of an operation control circuit, included in the first memory device that is illustrated in FIG. 2.

FIG. 4 is a block diagram, illustrating a configuration of the operation control circuit 110 in accordance with an embodiment. As illustrated in FIG. 4, the operation control circuit 110 may include a command decoder 111 and an enable signal generation circuit 112.

The command decoder 111 may generate the reference voltage command VRS and the ID command IDS by decoding the chip selection signal CS and the first to fifth command addresses CA<1:5> in synchronization with the clock CLK. The command decoder 111 may generate the reference voltage command VRS, which is enabled when the chip selection signal CS and the first to fifth command addresses CA<1:5> are the first logic level combination in synchronization with the clock CLK. The command decoder 111 may generate the ID command IDS, which is enabled when the chip selection signal CS and the first to fifth command addresses CA<1:5> are the second logic level combination in synchronization with the clock CLK. The command decoder 111 may compare the reference voltage VREF to the chip selection signal CS and the first to fifth command addresses CA<1:5> in synchronization with the clock CLK, and generate the reference voltage command VRS, which is enabled when the comparison result indicates that the chip selection signal CS and the first to fifth command addresses CA<1:5> are the first logic level combination. The command decoder 111 may compare the reference voltage VREF to the chip selection signal CS and the first to fifth command addresses CA<1:5> in synchronization with the clock CLK, and generate the ID command IDS, which is enabled when the comparison result indicates that the chip selection signal CS and the first to fifth command addresses CA<1:5> are the second logic level combination.

The enable signal generation circuit 112 may generate an ID enable signal ID_EN, which is enabled by the reference voltage command VRS and the ID command IDS. The enable signal generation circuit 112 may generate the ID enable signal ID_EN, which is disabled when the reference voltage command VRS is enabled. The enable signal generation circuit 112 may generate the ID enable signal ID_EN, which is enabled when the ID command IDS is enabled.

Figure 5:
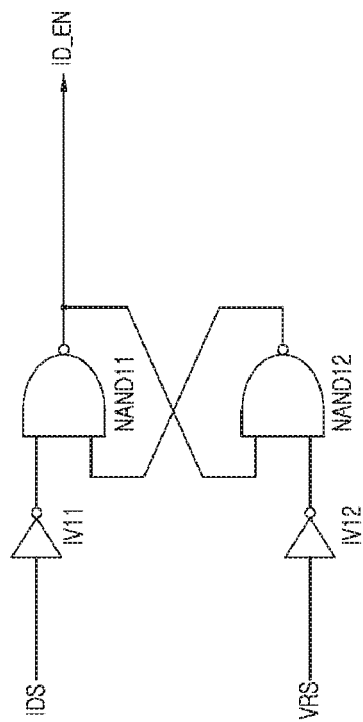
FIG. 5 is a circuit diagram, illustrating a configuration of an enable signal generation circuit, included in the operation control circuit that is illustrated in FIG. 4.

FIG. 5 is a circuit diagram, illustrating a configuration of the enable signal generation circuit 112 in accordance with an embodiment. As illustrated in FIG. 5, the enable signal generation circuit 112 may include inverters IV11 and IV12 and NAND gates NAND11 and NAND12.

The enable signal generation circuit 112 may generate the ID enable signal ID_EN, which is disabled to a logic low level when the reference voltage command VRS is enabled to a logic high level.

The enable signal generation circuit 112 may generate the ID enable signal ID_EN, which is enabled to a logic high level when the ID command IDS is enabled to a logic high level.

Figure 6:
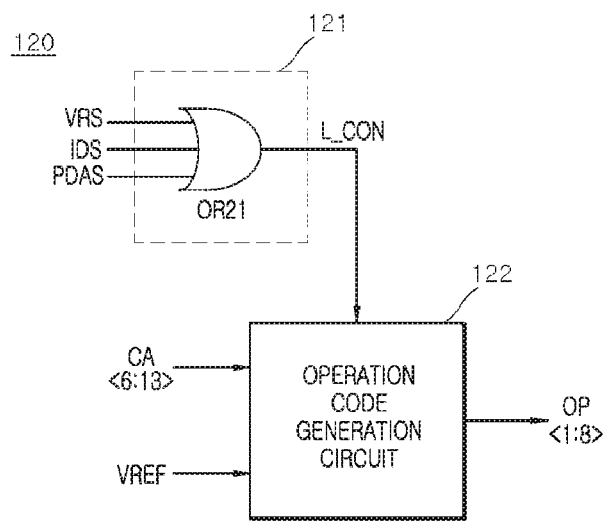
FIG. 6 is a diagram, illustrating a configuration of an input control circuit, included in the first memory device that is illustrated in FIG. 2.

FIG. 6 is a diagram, illustrating a configuration of the input control circuit 120 in accordance with an embodiment. As illustrated in FIG. 6, the input control circuit 120 may include a latch control signal generation circuit 121 and an operation code generation circuit 122.

The latch control signal generation circuit 121 may be implemented as an OR gate OR21. The latch control signal generation circuit 121 may generate a latch control signal L_CON, which is enabled when any one of the reference voltage command VRS, the ID command IDS and the ID selection control signal PDAS is enabled. The latch control signal generation circuit 121 may generate the latch control signal L_CON, which is enabled to a logic high level when the reference voltage command VRS is enabled to a logic high level. The latch control signal generation circuit 121 may generate the latch control signal L_CON, which is enabled to a logic high level when the ID command IDS is enabled to a logic high level. The latch control signal generation circuit 121 may generate the latch control signal L_CON, which is enabled to a logic high level when the ID selection control signal PDAS is enabled to a logic high level.

The operation code generation circuit 122 may generate the first to eighth operation codes OP<1:8> based on the sixth to 13th command addresses CA<6:13> based on the latch control signal L_CON.

When the latch control signal L_CON is enabled to a logic high level, the operation code generation circuit 122 may receive the sixth to 13th command addresses CA<6:13> by comparing the reference voltage VREF and the sixth to 13th command addresses CA<6:13>. The operation code generation circuit 122 may latch the received sixth to 13th command addresses CA<6:13>, when the latch control signal L_CON is enabled to a logic high level. The operation code generation circuit 122 may generate the first to eighth operation codes OP<1:8> based on the latched sixth to 13th command addresses CA<6:13>.

Figure 7:
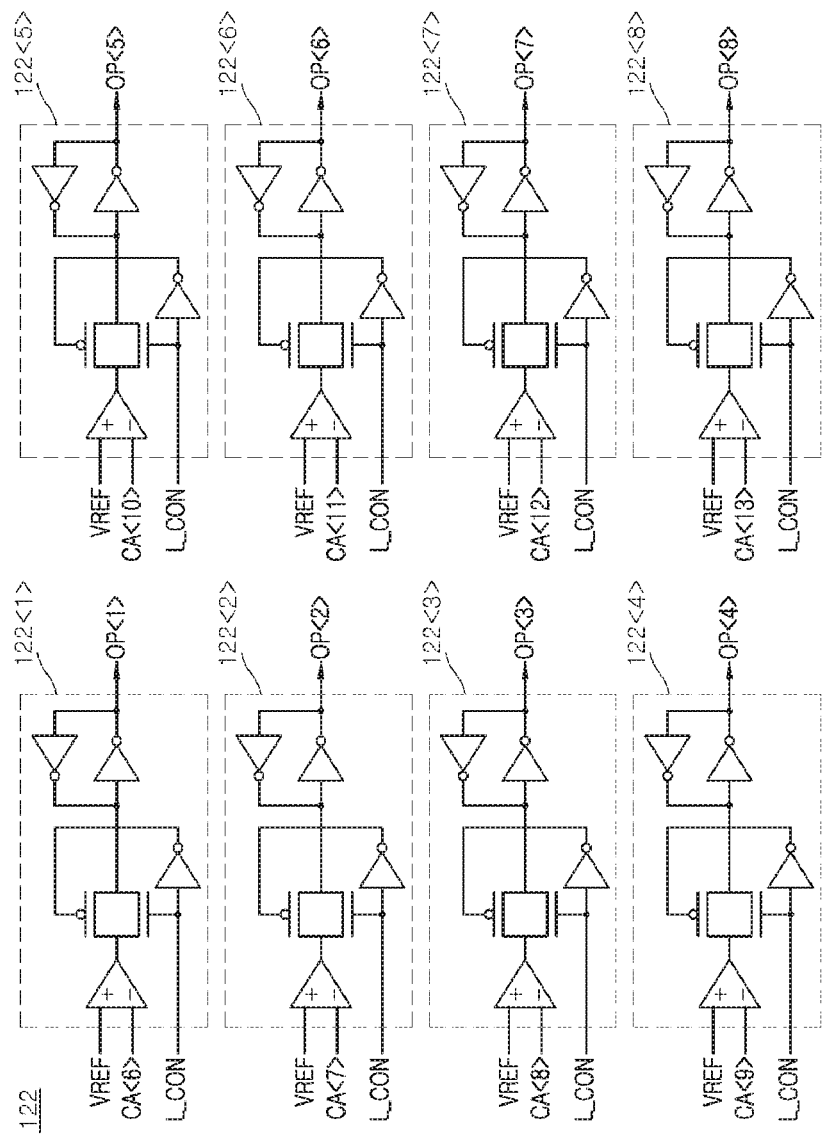
FIG. 7 is a circuit diagram, illustrating a configuration of an operation code generation circuit, included in the input control circuit that is illustrated in FIG. 6.

FIG. 7 is a circuit diagram, illustrating a configuration of the operation code generation circuit 122 in accordance with an embodiment. As illustrated in FIG. 7, the operation code generation circuit 122 may include a first operation code generation circuit 122<1>, a second operation code generation circuit 122<2>, a third operation code generation circuit 122<3>, a fourth operation code generation circuit 122<4>, a fifth operation code generation circuit 122<5>, a sixth operation code generation circuit 122<6>, a seventh operation code generation circuit 122<7> and an eighth operation code generation circuit 122<8>.

The first operation code generation circuit 122<1> may receive the sixth command address CA<6> by comparing the reference voltage VREF and the sixth command address CA<6>. The first operation code generation circuit 122<1> may receive and latch the sixth command address CA<6> when the latch control signal L_CON is enabled to a logic high level. The first operation code generation circuit 122<1> may invert and buffer the latched sixth command address CA<6>, and the first operation code generation circuit 122<1> may output the buffered address as the first operation code OP<1>.

The second to eighth operation code generation circuits 122<2> to 122<8> are implemented as the same circuits as the first operation code generation circuit 122<1> and operated in the same manner as the first operation code generation circuit 122<1>, except that the second to eighth operation code generation circuits 122<2> to 122<8> receive the seventh to 13th command addresses CA<7:13>, respectively. Therefore, the detailed descriptions thereof will be omitted herein.

Figure 8:
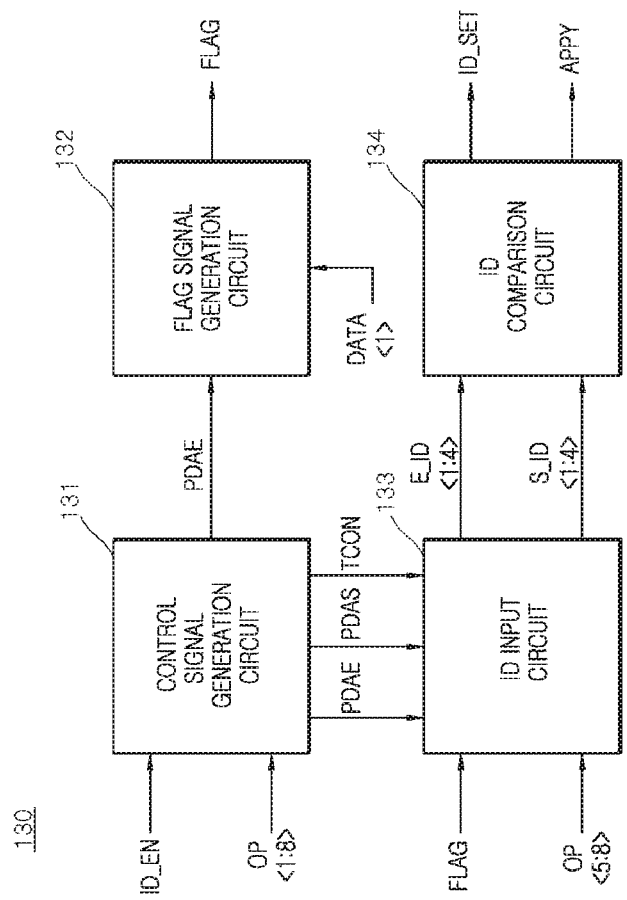
FIG. 8 is a diagram, illustrating a configuration of an ID setting circuit, included in the first memory device that is illustrated in FIG. 2.

FIG. 8 is a block diagram, illustrating a configuration of the ID setting circuit 130 in accordance with an embodiment. As illustrated in FIG. 8, the ID setting circuit 130 may include a control signal generation circuit 131, a flag signal generation circuit 132, an ID input circuit 133, and an ID comparison circuit 134.

The control signal generation circuit 131 may generate an ID input control signal PDAE, the ID selection control signal PDAS, and a transfer control signal TCON, which are enabled by the first to eighth operation codes OP<1:8> during an interval in which the ID enable signal ID_EN is enabled.

The flag signal generation circuit 132 may generate a flag signal FLAG, which is enabled when the first data DATA<1> is at a preset logic level, and the ID input control signal PDAE is enabled. The flag signal generation circuit 132 may generate the flag signal FLAG, which is enabled when the first data DATA<1> is at a logic low level, and the ID input control signal PDAE is enabled.

The ID input circuit 133 may generate the first to fourth storage IDs E_ID<1:4> based on the fifth to eighth operation codes OP<5:8> during an interval in which the ID input control signal PDAE and the flag signal FLAG are enabled. The ID input circuit 133 may generate the first to fourth storage IDs E_ID<1:4> by latching the fifth to eighth operation codes OP<5:8> during an interval in which the ID input control signal PDAE and the flag signal FLAG are enabled. The ID input circuit 133 may generate the first to fourth selection IDs S_ID<1:4> based on the fifth to eighth operation codes OP<5:8> according to the ID selection control signal PDAS and the transfer control signal ICON. The ID input circuit 133 may generate the first to fourth selection IDs S_ID<1:4> by latching the fifth to eighth operation codes OP<5:8> based on the ID selection control signal PDAS and the transfer control signal TCON.

The ID comparison circuit 134 may generate the ID control signal ID_SET and the supply control signal APPY by comparing the first to fourth storage IDs E_ID<1:4> and the first to fourth selection IDs S_ID<1:4>. The ID comparison circuit 134 may generate the ID control signal ID_SET and the supply control signal APPY, which are enabled when the first to fourth storage IDs E_ID<1:4> coincide with the first to fourth selection IDs S_ID<1:4>.

Figure 9:
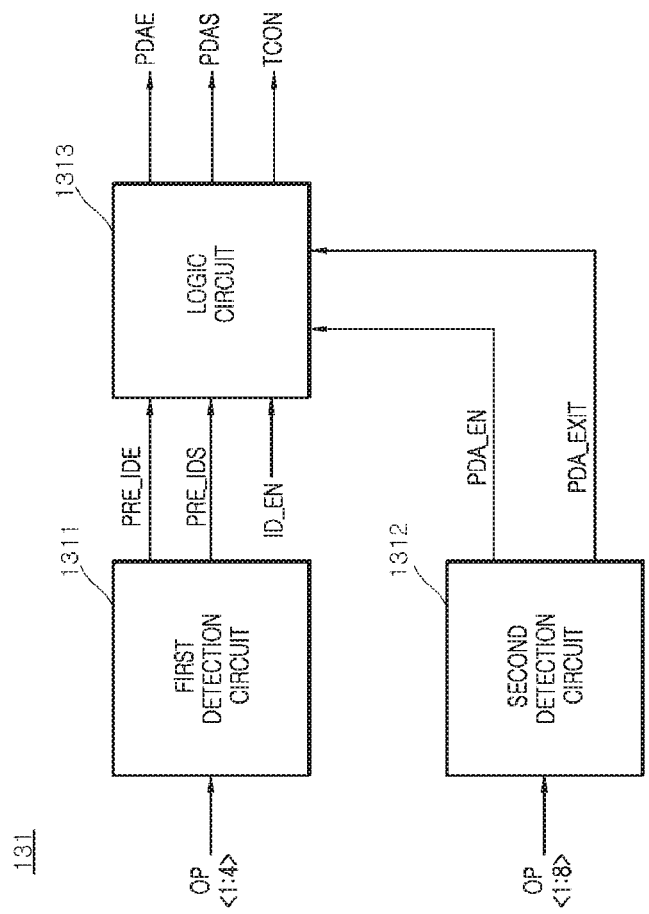
FIG. 9 is a block diagram, illustrating a configuration of a control signal generation circuit, included in the ID setting circuit that is illustrated in FIG. 8.

FIG. 9 is a block diagram, illustrating a configuration of the control signal generation circuit 131 in accordance with an embodiment. As illustrated in FIG. 9, the control signal generation circuit 131 may include a first detection circuit 1311, a second detection circuit 1312 and a logic circuit 1313.

The first detection circuit 1311 may generate a pre-ID setting signal PRE_IDE and a pre-ID selection signal PRE_IDS by detecting logic level combinations of the first to fourth operation codes OP<1:4>. The first detection circuit 1311 may generate the pre-ID setting signal PRE_IDE, which is enabled when the first operation code OP<1> is at a logic low level, the second operation code OP<2> is at a logic high level, the third operation code OP<3> is at a logic high level, and the fourth operation code OP<4> is at a logic low level. The first detection circuit 1311 may generate the pre-ID selection signal PRE_IDS, which is enabled when the first operation code OP<1> is at a logic low level, the second operation code OP<2> is at a logic high level, the third operation code OP<3> is at a logic high level, and the fourth operation code OP<4> is at a logic high level.

The second detection circuit 1312 may generate an ID setting entry signal PDA_EN and an ID setting exit signal PDA_EXIT by detecting logic level combinations of the first to eighth operation codes OP<1:8>. The second detection circuit 1312 may generate the ID setting entry signal PDA_EN, which is enabled when the first operation code OP<1> is at a logic low level, the second operation code OP<2> is at a logic low level, the third operation code OP<3> is at a logic low level, the fourth operation code OP<4> is at a logic low level, the fifth operation code OP<5> is at a logic high level, the sixth operation code OP<6> is at a logic low level, the seventh operation code OP<7> is at a logic high level, and the eighth operation code OP<8> is at a logic high level. The second detection circuit 1312 may generate the ID setting exit signal PDA_EXIT, which is enabled when the first operation code OP<1> is at a logic low level, the second operation code OP<2> is at a logic low level, the third operation code OP<3> is at a logic low level, the fourth operation code OP<4> is at a logic low level, the fifth operation code OP<5> is at a logic high level, the sixth operation code OP<6> is at a logic low level, the seventh operation code OP<7> is at a logic high level, and the eighth operation code OP<8> is at a logic low level.

The logic circuit 1313 may generate the ID input control signal PDAE and the ID selection control signal PDAS based on the pre-ID setting signal PRE_IDE and the pre-ID selection signal PRE_IDS during an interval in which the ID enable signal ID_EN is enabled. The logic circuit 1313 may generate the transfer control signal TCON based on the ID setting entry signal PDA_EN and the ID setting exit signal PDA_EXIT.

Figure 10:
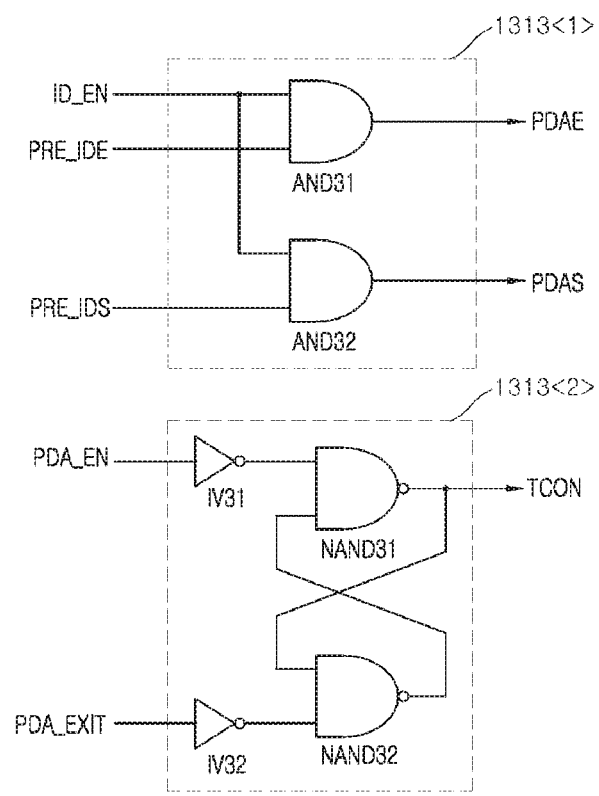
FIG. 10 is a circuit diagram, illustrating a configuration of a logic circuit, included in the control signal generation circuit that is illustrated in FIG. 9.

FIG. 10 is a circuit diagram, illustrating a configuration of the logic circuit 1313 in accordance with an embodiment. As illustrated in FIG. 10, the logic circuit 1313 may include a first logic circuit 1313<1> and a second logic circuit 1313<2>.

The first logic circuit 1313<1> may be implemented as AND gates AND31 and AND32. The first logic circuit 1313<1> may generate the ID input control signal PDAE by buffering the pre-ID setting signal PRE_IDE during an interval in which the ID enable signal ID_EN is enabled to a logic high level. The first logic circuit 1313<1> may generate the ID selection control signal PDAS by buffering the pre-ID selection signal PRE_IDS during an interval in which the ID enable signal ID_EN is enabled to a logic high level. The first logic circuit 1313<1> may generate the ID input control signal PDAE and the ID selection control signal PDAS, which are disabled to a logic low level when the ID enable signal ID_EN is disabled to a logic low level.

The second logic circuit 1313<2> may be implemented as inverters IV31 and IV32 and NAND gates NAND31 and NAND32. The second logic circuit 1313<2> may generate the transfer control signal TCON, which is enabled to a logic high level when the ID setting entry signal PDA_EN is inputted at a logic high level. The second logic circuit 1313<2> may generate the transfer control signal TCON, which is disabled to a logic low level when the ID setting exit signal PDA_EXIT is inputted at a logic high level. The second logic circuit 1313<2> may generate the transfer control signal TCON, which is enabled based on the time point that the ID setting entry signal PDA_EN is enabled to a logic high level to the time point that the ID setting exit signal PDA_EXIT is enabled to a logic high level.

Figure 11:
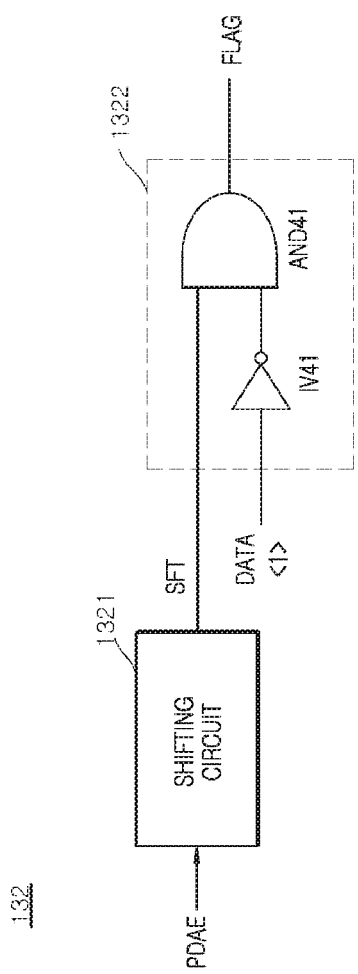
FIG. 11 is a diagram, illustrating a configuration of a flag signal generation circuit, included in the ID setting circuit that is illustrated in FIG. 8.

FIG. 11 is a diagram, illustrating a configuration of the flag signal generation circuit 132 in accordance with an embodiment. As illustrated in FIG. 11, the flag signal generation circuit 132 may include a shifting circuit 1321 and a flag signal output circuit 1322.

The shifting circuit 1321 may generate a shifting signal SFT by shifting the ID input control signal PDAE. The shifting circuit 1321 may generate the shifting signal SFT by shifting the ID input control signal PDAE based on an internal operation time point. According to an embodiment, the shifting interval of the shifting circuit 1321 may be set in various manners.

The flag signal output circuit 1322 may be implemented as an inverter IV41 and an AND gate AND1. The flag signal output circuit 1322 may generate the flag signal FLAG by buffering the shifting signal SFT when the first data DATA<1> is at a preset logic level. The flag signal output circuit 1322 may generate the flag signal FLAG by buffering the shifting signal SFT when the first data DATA<1> is at a logic low level.

Figure 12:
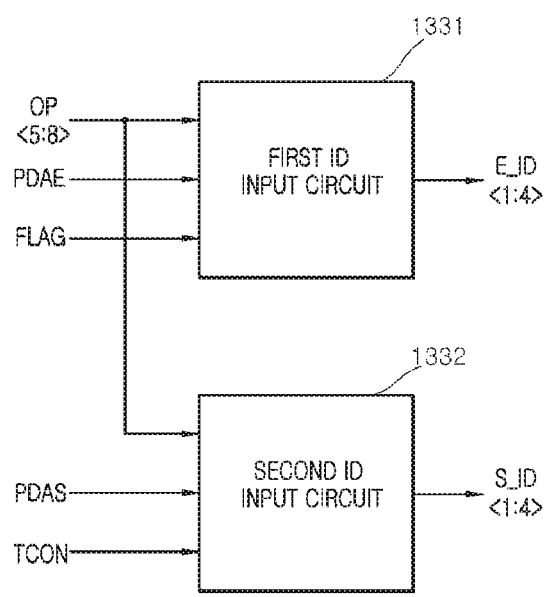
FIG. 12 is a block diagram, illustrating a configuration of an ID input circuit, included in the ID setting circuit that is illustrated in FIG. 8.

FIG. 12 is a block diagram, illustrating a configuration of the ID input circuit 133 in accordance with an embodiment. As illustrated in FIG. 12, the ID input circuit 133 may include a first ID input circuit 1331 and a second ID input circuit 1332.

The first ID input circuit 1331 may generate the first to fourth storage IDs E_ID<1:4> based on the fifth to eighth operation codes OP<5:8> during an interval in which the ID input control signal PDAE and the flag signal FLAG are enabled. The first ID input circuit 1331 may latch the fifth to eighth operation codes OP<5:8> during an interval in which the ID input control signal PDAE is enabled. The first ID input circuit 1331 may output the latched fifth to eighth operation codes OP<5:8> as the first to fourth storage IDs E_ID<1:4> during an interval in which the flag signal FLAG is enabled.

The second ID input circuit 1332 may generate the first to fourth selection IDs S_ID<1:4> based on the fifth to eighth operation codes OP<5:8> when any one of the ID selection control signal PDAS and the transfer control signal TCON is enabled. The second ID input circuit 1332 may output the fifth to eighth operation codes OP<5:8> as the first to fourth selection IDs S_ID<1:4> during an interval in which the ID selection control signal PDAS is enabled. The second ID input circuit 1332 may output the fifth to eighth operation codes OP<5:8> as the first to fourth selection IDs S_ID<1:4> during an interval in which the transfer control signal TCON is enabled.

Figure 13:
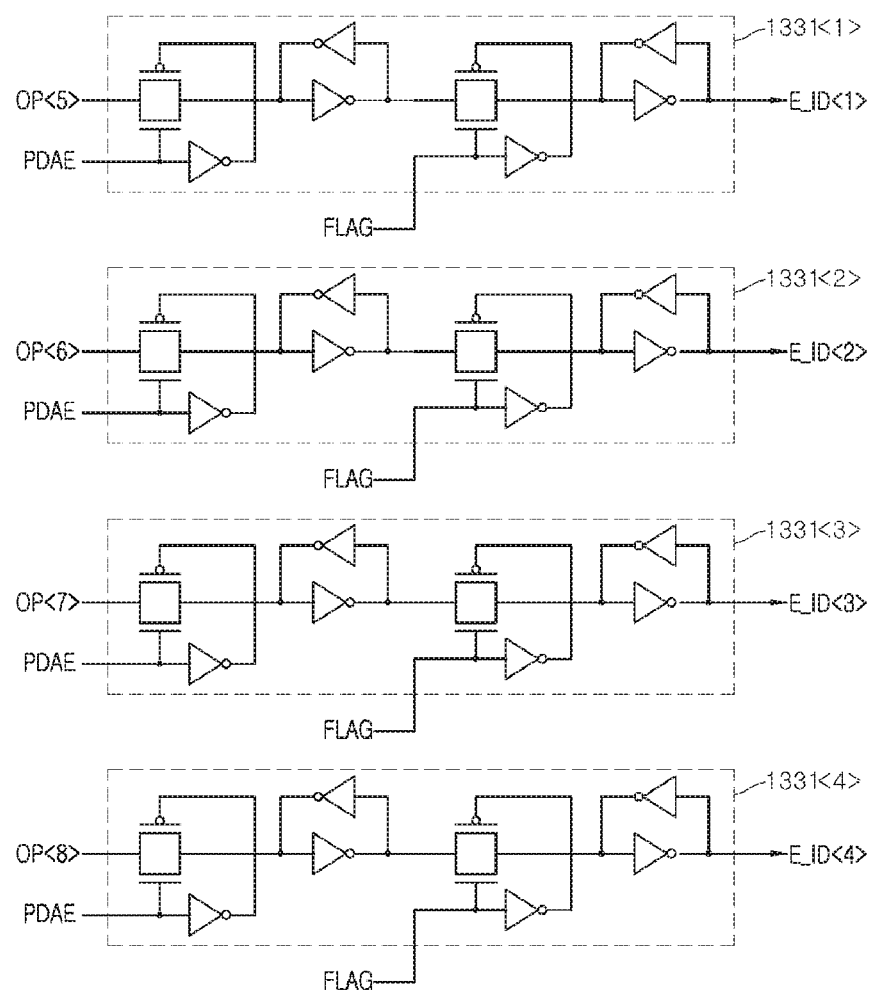
FIG. 13 is a circuit diagram, illustrating a configuration of a first ID input circuit, included in the ID input circuit that is illustrated in FIG. 12.

FIG. 13 is a circuit diagram, illustrating a configuration of the first ID input circuit 1331 in accordance with an embodiment. As illustrated in FIG. 13, the first ID input circuit 1331 may include a first latch circuit 1331<1>, a second latch circuit 1331<2>, a third latch circuit 1331<3>, and a fourth latch circuit 1331<4>.

The first latch circuit 1331<1> may receive the fifth operation code OP<5> during an interval in which the ID input control signal PDAE is enabled to a logic high level. The first latch circuit 1331<1> may latch the received fifth operation code OP<5>. The first latch circuit 1331<1> may buffer the latched fifth operation code OP<5> during an interval in which the flag signal FLAG is enabled to a logic high level, and output the buffered code as the first storage ID E_ID<1>.

The second to fourth latch circuits 1331<2> to 1331<4> are implemented as the same circuits as the first latch circuit 1331<1> and operated in the same manner as the first latch circuit 1331<1>, except that the second to fourth latch circuits 1331<2> to 1331<4> receive the sixth to eighth command addresses CA<6:8>, respectively. Therefore, the detailed descriptions thereof will be omitted herein.

Figure 14:
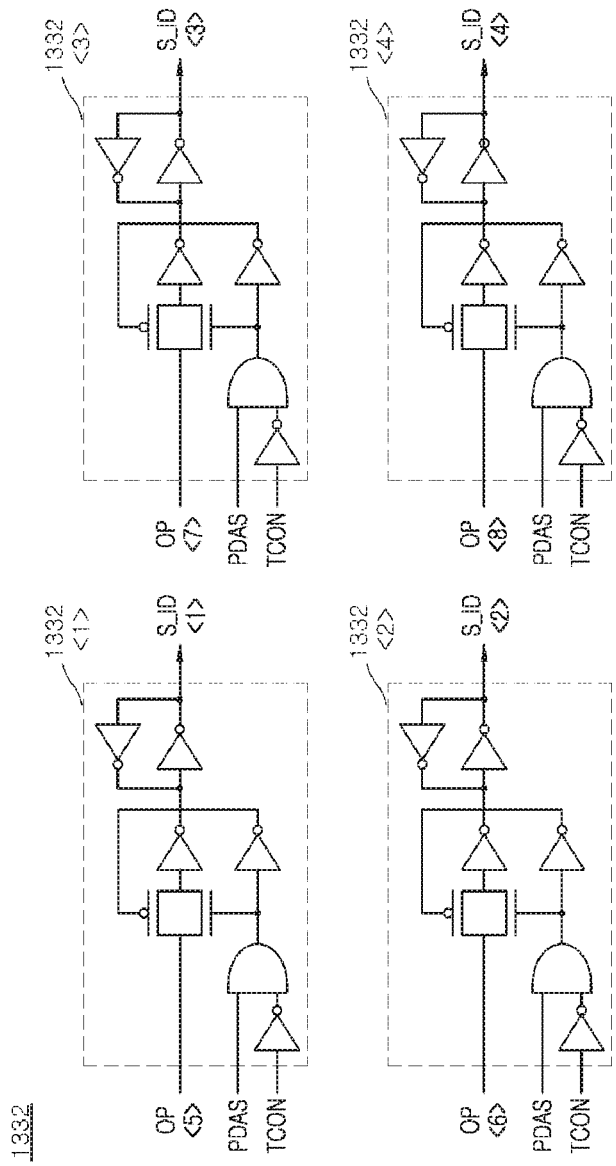
FIG. 14 is a circuit diagram, illustrating a configuration of a second ID input circuit, included in the ID input circuit that is illustrated in FIG. 12.

FIG. 14 is a circuit diagram, illustrating a configuration of the second ID input circuit 1332 in accordance with an embodiment. As illustrated in FIG. 14, the second ID input circuit 1332 may include a first transfer circuit 1332<1>, a second transfer circuit 1332<2>, a third transfer circuit 1332<3>, and a fourth transfer circuit 1332<4>.

The first transfer circuit 1332<1> may generate the first selection ID S_ID<1> by buffering the fifth operation code OP<5> based on the ID selection control signal PDAS and the transfer control signal TCON. The first transfer circuit 1332<1> may generate the first selection ID S_ID<1> by buffering the fifth operation code OP<5> when the ID selection control signal PDAS is enabled to a logic high level and the transfer control signal TCON is generated at a logic low level.

The second to fourth transfer circuits 1332<2> to 1332<4> are implemented as the same circuits as the first transfer circuit 1332<1> and operated in the same manner as the first transfer circuit 1332<1>, except that the second to fourth transfer circuits 1332<2> to 1332<4> receive the sixth to eighth command addresses CA<6:8>, respectively. Therefore, the detailed descriptions thereof will be omitted herein.

Figure 15:
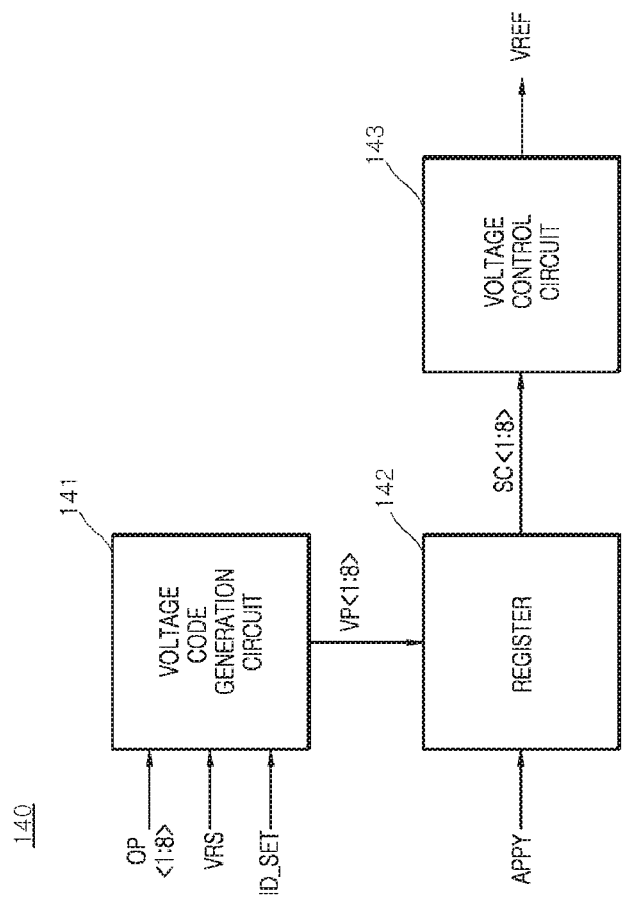
FIG. 15 is a block diagram, illustrating a configuration of a reference voltage generation circuit, included in the first memory device that is illustrated in FIG. 2.

FIG. 15 is a block diagram, illustrating a configuration of the reference voltage generation circuit 140 in accordance with an embodiment. As illustrated in FIG. 15, the reference voltage generation circuit 140 may include a voltage code generation circuit 141, a register 142, and a voltage control circuit 143.

The voltage code generation circuit 141 may generate the first to eighth voltage codes VP<1:8> based on the first to eighth operation codes OP<1:8> according to the reference voltage command VRS and the ID control signal ID_SET. The voltage code generation circuit 141 may generate the first to eighth voltage codes VP<1:8> by inverting and buffering the first to eighth operation codes OP<1:8> based on the reference voltage command VRS and the ID control signal ID_SET.

The register 142 may store the first to eighth voltage codes VP<1:8> when the supply control signal APPY is enabled. The register 142 may output the first to eighth voltage codes VP<1:8> as first to eighth stored codes SC<1:8>.

The voltage control circuit 143 may control the level of the reference voltage VREF based on the first to eighth stored codes SC<1:8>. The voltage control circuit 143 may generate the reference voltage VREF whose voltage level is controlled when the logic levels of the first to eighth stored codes SC<1:8> change. For example, the voltage control circuit 143 may generate the reference voltage VREF whose voltage level is increased when the first to eighth stored codes SC<1:8> are sequentially up-counted. The voltage control circuit 143 may generate the reference voltage VREF whose voltage level is decreased when the first to eighth stored codes SC<1:8> are sequentially down-counted.

Figure 16:
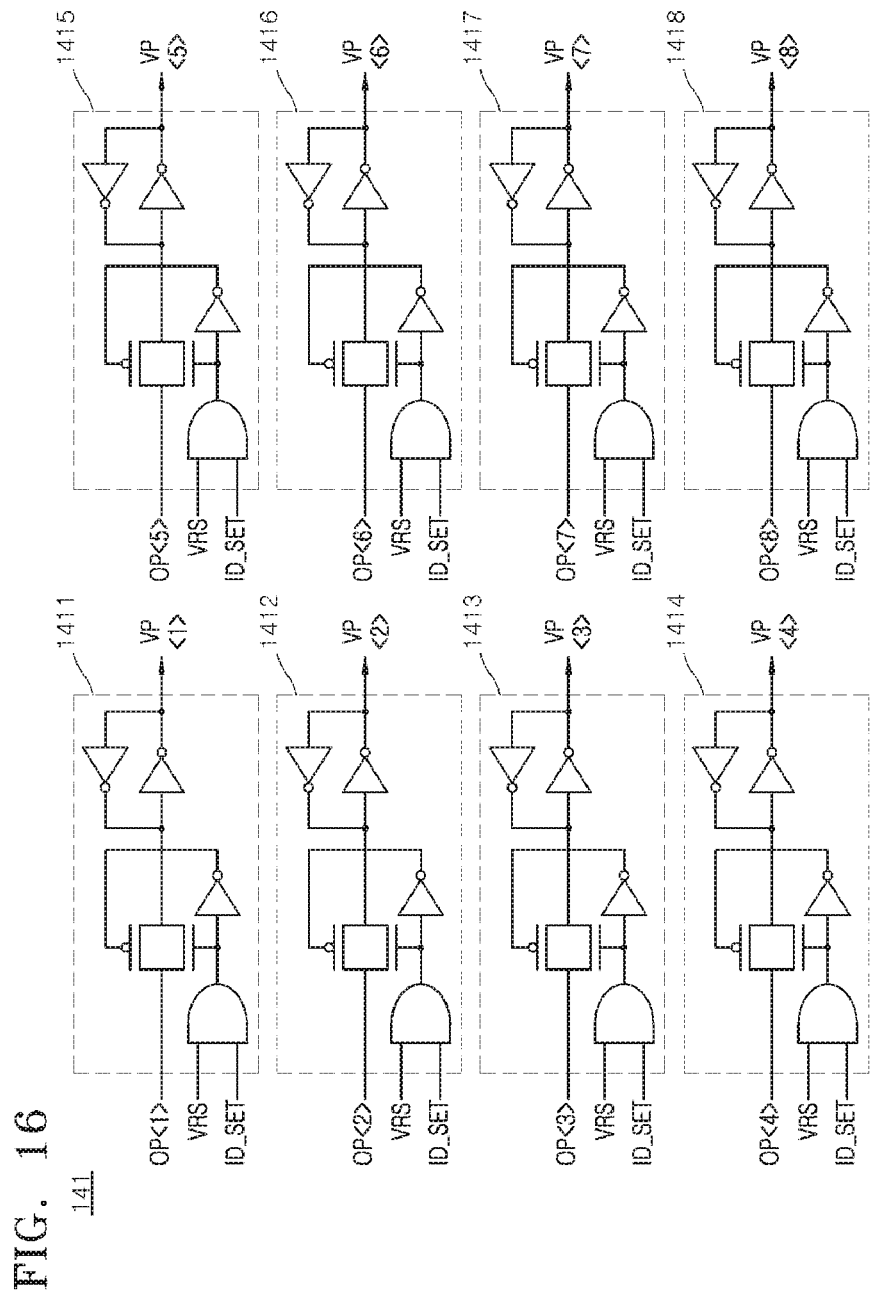
FIG. 16 is a circuit diagram, illustrating a configuration of a voltage code generation circuit, included in the reference voltage generation circuit that is illustrated in FIG. 15.

FIG. 16 is a circuit diagram, illustrating a configuration of the voltage code generation circuit 141 in accordance with an embodiment. As illustrated in FIG. 16, the voltage code generation circuit 141 may include a first code generation circuit 1411, a second code generation circuit 1412, a third code generation circuit 1413, a fourth code generation circuit 1414, a fifth code generation circuit 1415, a sixth code generation circuit 1416, a seventh code generation circuit 1417, and an eighth code generation circuit 1418.

The first code generation circuit 1411 may generate the first voltage code VP<1> by inverting and buffering the first operation code OP<1> when the reference voltage command VRS and the ID control signal ID_SET are enabled. The first code generation circuit 1411 may generate the first voltage code VP<1> by inverting and buffering the first operation code OP<1> when the reference voltage command VRS and the ID control signal ID_SET are enabled to a logic high level.

The second to eighth code generation circuits 1412 to 1418 are implemented as the same circuits as the first code generation circuit 1411 and operated in the same manner as the first code generation circuit 1411, except that the second to eighth code generation circuits 1412 to 1418 receive the sixth to eighth operation codes OP<2:8>, respectively. Therefore, the detailed descriptions thereof will be omitted herein.

Figure 17:
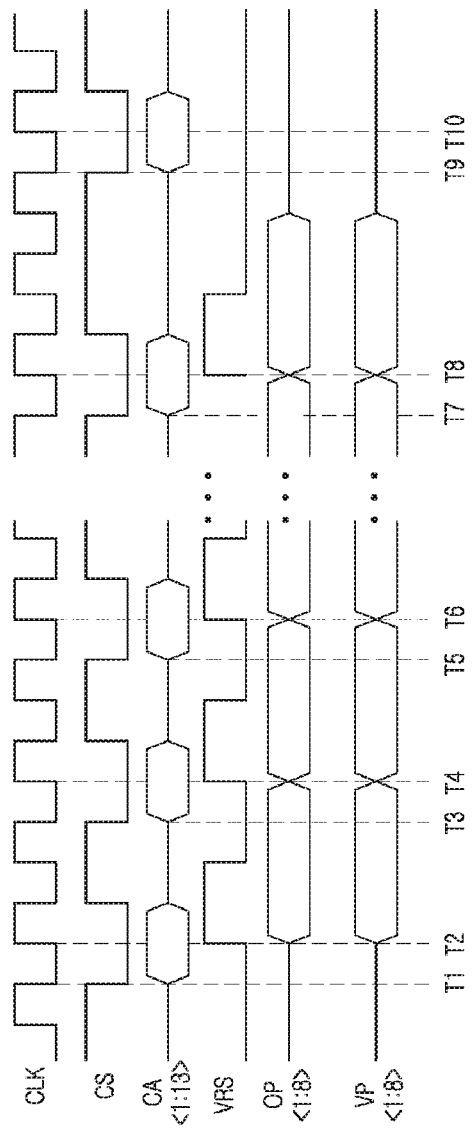
FIG. 17 is a timing diagram for describing the training mode of the system in accordance with the present embodiment.

Referring to FIG. 17, the operation of the system 1 in the reference voltage training mode will be described. In the following descriptions, the training mode of the first memory device 100 will be taken as an example for description.

At a time point T1, the controller 10 outputs, to the first memory device 100, the clock CLK, the low-level chip selection signal CS and the first logic level combination of the first to 13th command addresses CA<1:13> to perform the training mode.

At a time point T2, the operation control circuit 110 of the first memory device 100 may receive the first logic level combination of the chip selection signal CS and the first to fifth command addresses CA<1:5> in synchronization with the clock CLK and may generate the reference voltage command VRS at a logic high level.

The input control circuit 120 may receive the high-level reference voltage command VRS and may generate the first to eighth operation codes OP<1:8> based on the sixth to 13th command addresses CA<6:13>.

The reference voltage generation circuit 140 may receive the high-level reference voltage command VRS, and controls the level of the reference voltage VREF based on the first to eighth voltage codes VP<1:8>.

At a time point T3, the controller 10 outputs, to the first memory device 100, the clock CLK, the low-level chip selection signal CS and the first logic level combination of the first to 13th command addresses CA<1:13> to perform the training mode. At this time, the sixth to 13th command addresses CA<6:13> have a logic level combination in which the sixth to 13th command addresses CA<6:13> outputted at the time point T1 are up-counted.

At a time point T4, the operation control circuit 110 of the first memory device 100 may receive the first logic level combination of the chip selection signal CS and the first to fifth command addresses CA<1:5> in synchronization with the clock CLK and may generate the reference voltage command VRS at a logic high level.

The input control circuit 120 may receive the high-level reference voltage command VRS and may generate the first to eighth operation codes OP<1:8> based on the sixth to 13th command addresses CA<6:13>.

The reference voltage generation circuit 140 may receive the high-level reference voltage command VRS and may increase the level of the reference voltage VREF based on the first to eighth voltage codes VP<1:8>.

At a time point T5, the controller 10 outputs, to the first memory device 100, the clock CLK, the low-level chip selection signal CS and the first logic level combination of the first to 13th command addresses CA<1:13> to perform the training mode. At this time, the sixth to 13th command addresses CA<6:13> have a logic level combination in which the sixth to 13th command addresses CA<6:13> outputted at the time point T3 are up-counted.

At a time point T6, the operation control circuit 110 of the first memory device 100 may receive the first logic level combination of the chip selection signal CS and the first to fifth command addresses CA<1:5> in synchronization with the clock CLK and may generate the reference voltage command VRS at a logic high level.

The input control circuit 120 may receive the high-level reference voltage command VRS and may generate the first to eighth operation codes OP<1:8> based on the sixth to 13th command addresses CA<6:13>.

The reference voltage generation circuit 140 may receive the high-level reference voltage command VRS and may increase the level of the reference voltage VREF based on the first to eighth voltage codes VP<1:8>.

Then, the controller 10 sequentially up-counts the sixth to 13th command addresses CA<6:13> to perform the training mode and may output the up-counted addresses.

At a time point T7, the controller 10 outputs, to the first memory device 100, the clock CLK, the low-level chip selection signal CS and the first logic level combination of the first to 13th command addresses CA<1:13> to perform the training mode. At this time, the sixth to 13th command addresses CA<6:13> have a logic level combination in which the sixth to 13th command addresses CA<6:13> outputted at the previous time point are up-counted.

The operation control circuit 110 of the first memory device 100 may receive the first logic level combination of the chip selection signal CS and the first to fifth command addresses CA<1:5> in synchronization with the clock CLK and may generate the reference voltage command VRS at a logic high level.

The input control circuit 120 may receive the high-level reference voltage command VRS and may generate the first to eighth operation codes OP<1:8> based on the sixth to 13th command addresses CA<6:13>.

The reference voltage generation circuit 140 may receive the high-level reference voltage command VRS and may increase the level of the reference voltage VREF based on the first to eighth voltage codes VP<1:8>. At this time, the reference voltage VREF is generated at the set voltage level.

At a time point T9, the controller 10 outputs, to the first memory device 100, the clock CLK, the low-level chip selection signal CS and the first to 13th command addresses CA<1:13> to exit the training mode.

The operation control circuit 110 of the first memory device 100 may receive the chip selection signal CS and the first to fifth command addresses CA<1:5> in synchronization with the dock CLK and may generate the reference voltage command VRS at a logic low level.

The input control circuit 120 may receive the low-level reference voltage command VRS and might not generate the first to eighth operation codes OP<1:8>.

The reference voltage generation circuit 140 might not change the level of the reference voltage VREF. That is, the training mode is ended.

Figure 18:
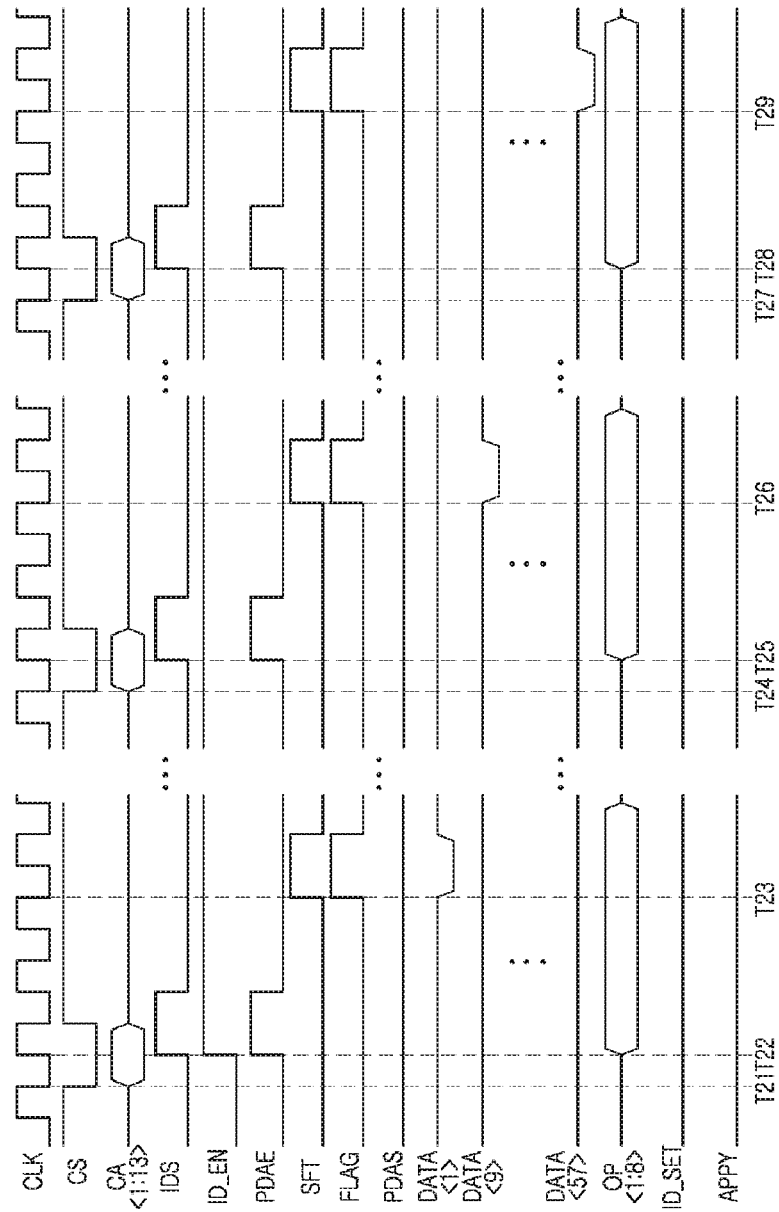
FIGS. 18 and 19 are timing diagrams for describing the ID setting mode and the ID selection mode of the system in accordance with the present embodiment.
Figure 19:
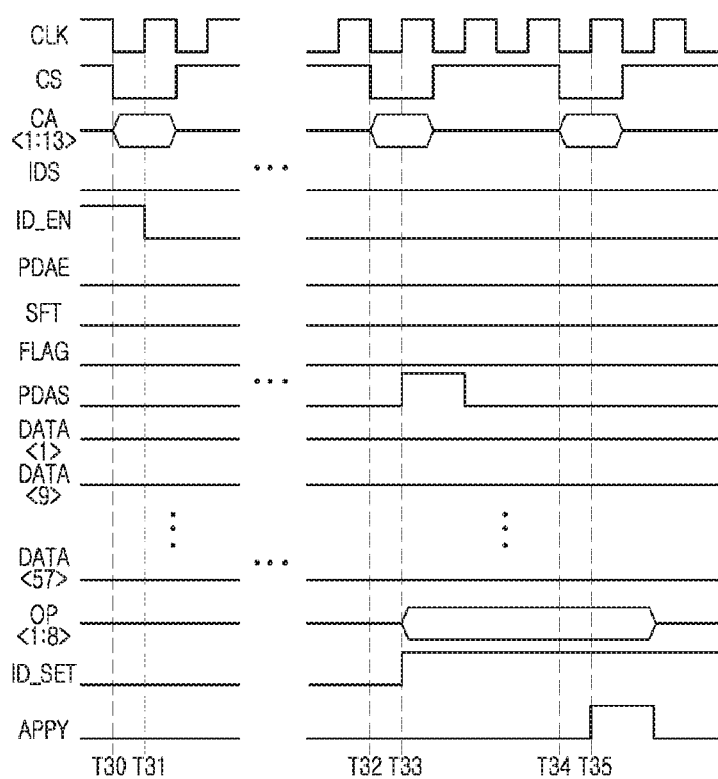

Referring to FIGS. 18 and 19, the operations of the system 1 in the ID setting mode and the ID selection mode will be described. In the following descriptions, the ID setting mode of the first to eighth memory devices 100, 200, 300, 400, 500, 600, 700, and 800, and the ID selection mode of the first memory device 100 will be taken as an example.

At a time point T21, the controller 10 outputs, to the first memory device 100, the clock CLK, the low-level chip selection signal CS and the second logic level combination of the first to 13th command addresses CA<1:13> to perform the ID setting mode.

At a time point T22, the operation control circuit 110 of the first memory device 100 may receive the second logic level combination of the chip selection signal CS and the first to fifth command addresses CA<1:5> in synchronization with the clock CLK and may generate the ID command IDS and the ID enable signal ID_EN at a logic high level.

The input control circuit 120 may receive the high-level ID command IDS and may generate the first to eighth operation codes OP<1:8> based on the sixth to 13th command addresses CA<6:13>.

The control signal generation circuit 131 may generate the ID input control signal PDAE, which is enabled to a logic high level by the first to eighth operation codes OP<1:8> during an interval in which the ID enable signal ID_EN is enabled to a logic high level.

At a time point T23, the controller 10 outputs the low-level first data DATA<1> to the first memory device 100.

The flag signal generation circuit 132 may generate the high-level shifting signal SFT by shifting the ID input control signal PDAE of the time point T22 and may generate the high-level flag signal FLAG by buffering the shifting signal SFT because the first data DATA<1> is at a logic low level.

The ID input circuit 133 may store the first to fourth storage IDs E_ID<1:4> by latching the fifth to eighth operation codes OP<5:8> based on the high-level flag signal FLAG.

At a time point T24, the controller 10 outputs, to the second memory device 200, the clock CLK, the low-level chip selection signal CS, and the second logic level combination of the first to 13th command addresses CA<1:13> to perform the ID setting mode.

At a time point T25, the operation control circuit (not illustrated) of the second memory device 200 may receive the second logic level combination of the chip selection signal CS and the first to fifth command addresses CA<1:5> in synchronization with the clock CLK and may generate the ID command IDS and the ID enable signal ID_EN at a logic high level.

The input control circuit (not illustrated) may receive the high-level ID command IDS and may generate the first to eighth operation codes OP<1:8> based on the sixth to 13th command addresses CA<6:13>.

The control signal generation circuit (not illustrated) may generate the ID input control signal PDAE, which is enabled to a logic high level by the first to eighth operation codes OP<1:8> during an interval in which the ID enable signal ID_EN is enabled to a logic high level.

At a time point T26, the controller 10 outputs the low-level ninth data DATA<9> to the second memory device 200.

The flag signal generation circuit (not illustrated) may generate the high-level shifting signal SFT by shifting the ID input control signal PDAE of the time point T25 and may generate the high-level flag signal FLAG by buffering the shifting signal SFT because the ninth data DATA<9> is at a logic low level.

The ID input circuit 133 may store the first to fourth storage IDs E_ID<1:4> by latching the fifth to eighth operation codes OP<5:8> based on the high-level flag signal FLAG.

Then, in order to control the ID setting modes of the third to seventh memory devices 300, 400, 500, 600, and 700, the controller 10 may sequentially output the clock CLK, the low-level chip selection signal CS, the second logic level combination of the first to 13th command addresses CA<1:13>, the 17th data DATA<17>, the 25th data DATA<25>, the 33rd data DATA<33>, the 41st data DATA<41>, and the 49th data DATA<49>.

The third to seventh memory devices 300, 400, 500, 600, and 700 store the first to fourth storage IDs E_ID<1:4> having different logic level combinations.

The operations of the third to seventh memory devices 300 to 700 in ID setting mode are performed in the same manner as the above-described operations of the first and second memory devices 100 and 200 in the ID setting mode. Thus, the detailed descriptions are omitted herein.

At a time point T27, the controller 10 outputs, to the eighth memory device 800, the clock CLK, the low-level chip selection signal CS and the second logic level combination of the first to 13th command addresses CA<1:13> to perform the ID setting mode.

At a time point T28, the operation control circuit (not illustrated) of the eighth memory device 800 may receive the second logic level combination of the chip selection signal CS and the first to fifth command addresses CA<1:5> in synchronization with the clock CLK and may generate the ID command IDS and the ID enable signal ID_EN at a logic high level.

The input control circuit (not illustrated) may receive the high-level ID command IDS and may generate the first to eighth operation codes OP<1:8> based on the sixth to 13th command addresses CA<6:13>.

The control signal generation circuit (not illustrated) may generate the ID input control signal PDAE, which is enabled to a logic high level by the first to eighth operation codes OP<1:8> during an interval in which the ID enable signal ID_EN is enabled to a logic high level.

At a time point T29, the controller 10 outputs the low-level 57th data DATA<57> to the eighth memory device 800.

The flag signal generation circuit (not illustrated) may generate the high-level shifting signal SFT by shifting the ID input control signal PDAE of the time point T28 and may generate the high-level flag signal FLAG by buffering the shifting signal SFT because the ninth data DATA<9> is at a logic low level.

The ID input circuit 133 may generate the first to fourth storage IDs E_ID<1:4> by latching the fifth to eighth operation codes OP<5:8> based on the high-level flag signal FLAG. At this time, the first to fourth storage IDs E_ID<1:4> stored in the eighth memory device 800 are generated as a logic level combination different from that of the first to fourth storage IDs E_ID<1:4> stored in each of the first to seventh memory devices 100, 200, 300, 400, 500, 600, and 700.

At a time point T30, the controller 10 outputs, to the first to eighth memory devices 100, 200, 300, 400, 500, 600, 700, and 800, the clock CLK, the low-level chip selection signal CS and the first to 13th command addresses CA<1:13> to exit the ID setting mode.

At a time point T31, the operation control circuit 110 of the first memory device 100 may receive the chip selection signal CS and the first to fifth command addresses CA<1:5> in synchronization with the clock CLK and may generate the ID command IDS and the ID enable signal ID_EN at a logic low level.

The input control circuit 120 may receive the low-level ID command IDS and might not generate the first to eighth operation codes OP<1:8>. That is, the ID setting mode is ended.

Since the ID setting modes of the second to eighth memory devices 200, 300, 400, 500, 600, 700, and 800 are performed in the same manner as the ID setting mode of the first memory device 100, the detailed descriptions thereof are omitted herein.

At a time point T32, the controller 10 outputs, to the first memory device 100, the clock CLK, the low-level chip selection signal CS and the third logic level combination of the first to 13th command addresses CA<1:13> to perform the ID selection mode.

At a time point T33, the ID setting circuit 130 may generate the ID selection control signal PDAS, which is enabled to a logic high level during the ID selection mode.

The input control circuit 120 may receive the high-level ID selection control signal PDAS and may generate the first to eighth operation codes OP<1:8> based on the sixth to 13th command addresses CA<6:13>.

The ID input circuit 133 may generate the first to fourth selection IDs S_ID<1:4> by latching the fifth to eighth operation codes OP<5:8> based on the high-level ID selection control signal PDAS.

The ID comparison circuit 134 may generate the high-level ID control signal ID_SET by comparing the first to fourth storage IDs E_ID<1:4> and the first to fourth selection IDs S_ID<1:4>.

At a time point T34, the controller 10 outputs the first to 13th command addresses CA<1:13> to the first memory device 100.

At a time point T35, the ID comparison circuit 134 may generate the supply control signal APPY enabled to a logic high level, by comparing the first to fourth storage IDs E_ID<1:4> to the first to fourth selection IDs S_ID<1:4> that are generated based on the first to 13th command addresses CA<1:13>.

The reference voltage generation circuit 140 may receive the high-level supply control signal APPY and may store the first to eighth voltage codes VP<1:8>. The reference voltage generation circuit 140 controls the level of the reference voltage VREF based on the stored first to eighth voltage codes VP<1:8>.

The system 1 may perform the training mode to generate the voltage codes to set the voltage level of the reference voltage VREF, used in the first to eighth memory devices 100, 200, 300, 400, 500, 600, 700, and 800, based on the command addresses inputted that are from the controller 10. The system 1 may perform the ID setting mode to set the storage IDs of the first to eighth memory devices 100, 200, 300, 400, 500, 600, 700 and 800 based on the command addresses that are inputted from the controller 10. The system 1 may perform the ID selection mode to compare the storage IDs stored in the ID setting mode and the selection IDs that are inputted from the controller 10 and to update the voltage codes that are generated in the training mode by selectively enabling the operations of the first to eighth memory devices 100, 200, 300, 400, 500, 600, 700, and 800.

Figure 20:
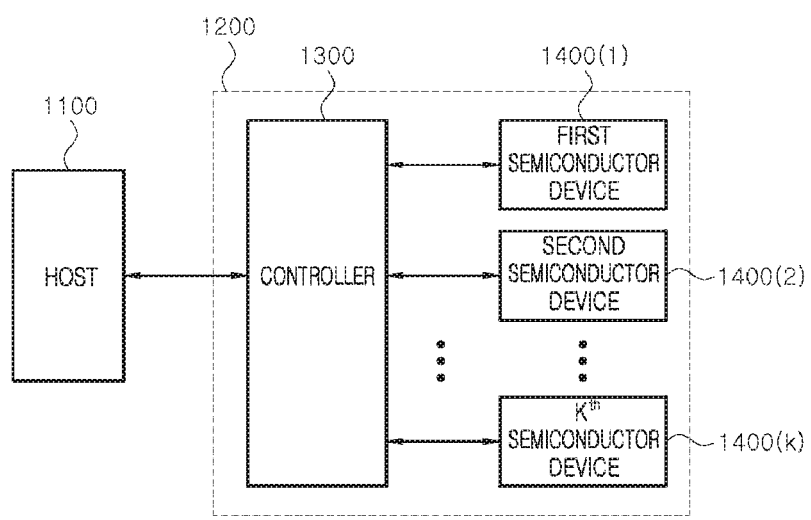
FIG. 20 is a diagram, illustrating a configuration of an electronic system in accordance with an embodiment to which the system to perform a reference voltage training operation, illustrated in FIGS. 1 to 19, is applied.

FIG. 20 is a block diagram, illustrating a configuration of an electronic system 1000 in accordance with an embodiment. As illustrated in FIG. 19, the electronic system 1000 may include a host 1100 and a semiconductor system 1200.

The host 1100 and the semiconductor system 1200 may transmit/receive signals to/from each other using an interface protocol. Examples of the interface protocol used between the host 1100 and the semiconductor system 1200 may include an MMC (Multi-Media Card), ESDI (Enhanced Small Disk Interface), IDE (Integrated Drive Electronics), PCI-E (Peripheral Component Interconnect-Express), ATA (Advanced Technology Attachment), SATA (Serial ATA), PATA (Parallel ATA), SAS (Serial Attached SCSI), USB (Universal Serial Bus), and the like.

The semiconductor system 1200 may include a controller 1300 and semiconductor devices 1400(K:1). The controller 1300 may control the semiconductor devices 1400(K:1) to perform a training mode. The controller 1300 may control the semiconductor devices 1400(K:1) to perform an ID setting mode. The controller 1300 may control the semiconductor devices 1400(K:1) to perform an ID selection mode. Each of the semiconductor devices 1400(K:1) may perform the training mode to generate voltage codes to set the voltage level of a reference voltage, which is used in a plurality of memory devices, from command addresses inputted from the controller. Furthermore, each of the semiconductor devices 1400(K:1) may perform the ID setting mode to set storage IDs of the plurality of memory devices from the command addresses inputted from the controller. Each of the semiconductor devices 1400(K:1) may perform the ID selection mode to compare the storage IDs stored in the ID setting mode and selection IDs inputted from the controller and to update the voltage codes that are generated in the training mode by selectively enabling the operations of the plurality of memory devices.

The controller 1300 may be implemented as the controller 10 illustrated in FIG. 10. The semiconductor devices 1400 (K:1) may be implemented as the semiconductor device 20 illustrated in FIG. 1. According to an embodiment, the semiconductor device 20 may be implemented as one of a DRAM (dynamic random access memory), PRAM (Phase change Random Access Memory), RRAM (Resistive Random Access Memory), MRAM (Magnetic Random Access Memory) and FRAM (Ferroelectric Random Access Memory).

Although preferred embodiments of the invention have been disclosed for illustrative purposes, those skilled in the art will appreciate that various modifications, additions and substitutions are possible, without departing from the scope and spirit of the invention as defined in the accompanying claims.

What is claimed is:

1. A system to perform a reference voltage training operation, the system comprising:
    a controller configured to output a clock signal, a chip selection signal, a command address, and data; and
    a semiconductor device configured to enter a training mode to control the level of a reference voltage when the chip selection signal and the command address are a first logic level combination in synchronization with the clock signal, configured to enter an ID setting mode to set a storage ID when the chip selection signal and the command address are a second logic level combination, and configured to enter an ID selection mode to update a voltage code that is generated in the training mode when the chip selection signal and the command address are a third logic level combination.

2. The system of claim 1, wherein the semiconductor device comprises a plurality of memory devices, and
    wherein the semiconductor device sets the storage IDs of the plurality of memory devices in the ID setting mode and updates the voltage code in a memory device to which the same selection ID as the storage ID is inputted, among the plurality of memory devices, in the ID selection mode.

3. The system of claim 1, wherein the training mode is a mode to control the voltage level of the reference voltage to a set voltage level.

4. The system of claim 1, wherein the ID setting mode is a mode to set the storage ID for a memory device in which data is inputted to the plurality of memory devices are at a preset logic level.

5. The system of claim 1, wherein the storage ID is generated by latching an operation code that is generated based on the command address that is inputted in the ID setting mode.

6. The system of claim 1, wherein the voltage code has a logic level combination that is changed to control the level of the reference voltage in the training mode, and
    wherein the voltage code is generated by latching an operation code that is generated based on the command address inputted in the training mode.

7. A system to perform a reference voltage training operation, the system comprising:
    a controller configured to output a clock signal, a chip selection signal, a command address, first data, and second data; and
    a semiconductor device comprising a first memory device and a second memory device, wherein the semiconductor device is configured to enter a training mode to control the level of a reference voltage when the chip selection signal and the command address are a first logic level combination in synchronization with the clock signal, wherein the semiconductor device is configured to, when the chip selection signal and the command address are a second logic level combination, enter an ID setting mode to set a first storage ID for the first memory device and then set a second storage ID for the second memory device, and wherein the semiconductor device is configured to enter an ID selection mode to update a voltage code in the first and second memory devices when the chip selection signal and the command address are a third logic level combination.

8. The system of claim 7, wherein the ID setting mode is a mode to set the first storage ID for the first memory device when the first data inputted to the first memory device is at a preset logic level, and setting the second storage ID for the second memory device when the second data inputted to the second memory device is at the preset logic level.

9. The system of claim 7, wherein the first and second storage IDs are generated by latching an operation code that is generated based on the command address that is inputted in the ID setting mode.

10. The system of claim 7, wherein the voltage code has a logic level combination that is changed to control the level of the reference voltage in the training mode, and wherein the voltage code is generated by latching an operation code that is generated based on the command address inputted in the training mode.

11. The system of claim 7, wherein the first memory device comprises:

a first operation control circuit configured to generate a first reference voltage command that is enabled when the chip selection signal and the command address are the first logic level combination based on a first reference voltage in synchronization with the clock signal and configured to generate a first ID command and a first ID enable signal that are enabled when the chip selection signal and the command address are the second logic level combination based on the first reference voltage in synchronization with the clock signal;

a first input control circuit configured to generate a first operation code from the command address based on the first reference voltage when any one of the first reference voltage command and the first ID command is enabled;

a first ID setting circuit configured to store the first storage ID generated based on the first operation code when the first data is at the preset logic level during an interval in which the first ID enable signal is enabled in the ID setting mode and configured to generate a first ID control signal and a first supply control signal when the first storage ID coincides with a first selection ID that is generated based on the input first operation code during the ID selection mode; and a first reference voltage generation circuit configured to generate a first voltage code based on the first operation code when the first ID control signal is enabled, configured to store the first voltage code when the first supply control signal is enabled, and configured to control the level of the first reference voltage based on the first voltage code when the first reference voltage command is enabled.

12. The system of claim 11, wherein the first operation control circuit comprises:

a first command decoder configured to generate the first reference voltage command that is enabled when the chip selection signal and the command address are the first logic level combination based on the first reference voltage in synchronization with the clock signal and configured to generate the first ID command that is enabled when the chip selection signal and the command address are the second logic level combination based on the first reference voltage; and a first enable signal generation circuit configured to generate the first ID enable signal that is disabled when the first reference voltage command is enabled and enabled when the first ID command is enabled.

13. The system of claim 11, wherein the first input control circuit comprises:

a first latch control signal generation circuit configured to generate a first latch control signal that is enabled when any one of the first reference voltage command and the first ID command is enabled; and a first operation code generation circuit configured to latch the command address based on the first reference voltage when the first latch control signal is enabled and configured to generate the first operation code based on the latched command address.

14. The system of claim 11, wherein the first ID setting circuit comprises:

a first control signal generation circuit configured to generate a first ID input control signal, a first ID selection control signal, and a first transfer control signal that are enabled by the first operation code during an interval in which the first ID enable signal is enabled;

a first flag signal generation circuit configured to generate a first flag signal that is enabled when the first data is at the preset logic level and the first ID input control signal is enabled;

a first ID input circuit configured to generate the first storage ID based on the first operation code during an interval in which the first ID input control signal and the first flag signal are enabled and configured to generate the first selection ID based on the first operation code when any one of the first ID selection control signal and the first transfer control signal is enabled; and a first ID comparison circuit configured to generate the first ID control signal and the first supply control signal when the first storage ID and the first selection ID coincide with each other.

15. The system of claim 11, wherein the first reference voltage generation circuit comprises:

a first voltage code generation circuit configured to generate a first voltage code based on the first operation code when the first reference voltage command and the first ID control signal are enabled;

a first register configured to store the first voltage code when the first supply control signal is enabled and configured to generate a first stored code based on the stored first voltage code; and a first voltage control circuit configured to control the level of the first reference voltage based on the first stored code.

16. The system of claim 7, wherein the second memory device comprises:

a second operation control circuit configured to generate a second reference voltage command that is enabled when the chip selection signal and the command address are the first logic level combination based on a second reference voltage in synchronization with the clock signal and configured to generate a second ID command and a second ID enable signal that are enabled when the chip selection signal and the command address are the second logic level combination based on the second reference voltage in synchronization with the clock signal;

a second input control circuit configured to generate a second operation code from the command address based on the second reference voltage when any one of the second reference voltage command and the second ID command is enabled;

a second ID setting circuit configured to store the second storage ID that is generated based on the second operation code when the second data is at the preset logic level during an interval in which the second ID enable signal is enabled in the ID setting mode and configured to generate a second ID control signal and a second supply control signal when the second storage ID coincides with a second selection ID that is generated based on the input second operation code during the ID selection mode; and a second reference voltage generation circuit configured to generate a second voltage code based on the second operation code when the second ID control signal is enabled, configured to store the second voltage code when the second supply control signal is enabled, and configured to control the level of the second reference voltage based on the second voltage code when the second reference voltage command is enabled.

17. The system of claim 16, wherein the second operation control circuit comprises:

a second command decoder configured to generate the second reference voltage command that is enabled when the chip selection signal and the command address are the first logic level combination based on the second reference voltage in synchronization with the clock signal and configured to generate the second ID command that is enabled when the chip selection signal and the command address are the second logic level combination based on the second reference voltage; and a second enable signal generation circuit configured to generate the second ID enable signal that is disabled when the second reference voltage command is enabled and enabled when the second ID command is enabled.

18. The system of claim 16, wherein the second input control circuit comprises:

a second latch control signal generation circuit configured to generate a second latch control signal that is enabled when any one of the second reference voltage command and the second ID command is enabled; and a second operation code generation circuit configured to latch the command address based on the second reference voltage when the second latch control signal is enabled and configured to generate the second operation code based on the latched command address.

19. The system of claim 16, wherein the second ID setting circuit comprises:

a second control signal generation circuit configured to generate a second ID input control signal, a second ID selection control signal, and a second transfer control signal that are enabled by the second operation code during an interval in which the second ID enable signal is enabled;

a second flag signal generation circuit configured to generate a second flag signal that is enabled when the second data is at the preset logic level and the second ID input control signal is enabled;

a second ID input circuit configured to generate the second storage ID based on the second operation code during an interval in which the second ID input control signal and the second flag signal are enabled and configured to generate the second selection ID based on the second operation code when any one of the second ID selection control signal and the second transfer control signal is enabled; and a second ID comparison circuit configured to generate the second ID control signal and the second supply control signal when the second storage ID and the second selection ID coincide with each other.

20. The system of claim 16, wherein the second reference voltage generation circuit comprises:

a second voltage code generation circuit configured to generate a second voltage code based on the second operation code when any one of the second reference voltage command and the second ID control signal is enabled;

a second register configured to store the second voltage code when the second supply control signal is enabled and configured to generate a second stored code based on the stored second voltage code; and a second voltage control circuit configured to control the level of the second reference voltage based on the second stored code.

* * * * *